United States Patent
Tsai

(10) Patent No.: US 6,219,252 B1
(45) Date of Patent: Apr. 17, 2001

(54) UNIVERSAL DOCKING STATION

(75) Inventor: Thomas R. L. Tsai, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/476,040

(22) Filed: Dec. 31, 1999

(30) Foreign Application Priority Data

Dec. 31, 1998 (TW) ............................................... 87222055

(51) Int. Cl.$^7$ ...................................................... H05K 5/00
(52) U.S. Cl. ..................... 361/752; 361/759; 361/801; 361/802; 361/796; 174/35 R; 211/41.17
(58) Field of Search ..................... 361/752, 753, 361/759, 796, 800, 818; 174/35 R; 211/41.17; 220/4.02

(56) References Cited

U.S. PATENT DOCUMENTS

| | | | |
|---|---|---|---|
| 4,303,296 | * 12/1981 | Spaulding | 339/122 R |
| 4,672,510 | * 6/1987 | Castner | 361/818 |
| 5,313,369 | * 5/1994 | Lewis et al. | 361/796 |
| 5,715,139 | * 2/1998 | Nakajima | 361/683 |

* cited by examiner

*Primary Examiner*—Jeffrey Gaffin
*Assistant Examiner*—Tuan Dinh
(74) *Attorney, Agent, or Firm*—Wei Te Chung

(57) ABSTRACT

A universal docking station includes an upper shell, a lower shell, and a circuit board carrying a plurality of connectors thereon. The lower shell has a bottom section, a front and rear panels respectively extending from longitudinal edges of the bottom section. A plurality of ports is formed in predetermined positions of the panels for receiving connectors therein. The lower shell has several supporting blocks for supporting the circuit board at a predetermined position after the upper and the lower shells are assembled together. An interlocking means comprises an upper and lower locking devices for assembling the upper and the lower shells together.

3 Claims, 5 Drawing Sheets

UNIVERSAL DOCKING STATION

BACKGROUND OF THE INVENTION

The present invention relates to a universal docking station, and particularly to a docking station with an interlocking mechanism for assembling upper and lower shells together.

With the development of computer technology, mobile computers, especially notebook computers, are becoming increasing popular. Connectors for transferring signals or power between a computer and exterior devices, such as a printer, a keyboard and a monitor, are commonly assembled within an enclosure of the computer. The connectors occupy a significant amount of space within the computer thereby increasing the volume thereof. To reduce the volume of the computer, especially a notebook computer, the connectors are commonly disposed outside of the computer and concentrated in a docking station. The docking station connects the computer and the exterior devices by a small number of high-density cables and corresponding connectors.

Related invention is disclosed in Taiwan Patent Application No. 87301097. Referring to FIG. 1, ports 12 are provided in a connecting section of upper and lower shells 10, 11 of a conventional docking station 1. During insertion/withdrawal between a cable end connector and the docking connector, additional force will be exposed to one of the upper and lower shells. After a period time of usage, a gap will be generated between the junction of the upper and lower shells. In addition, the quality of the signal transmission will be negatively effected as the EMI shield provided by the upper and lower shells is broken.

BRIEF SUMMARY OF THE INVENTION

A main object of the present invention is to provide a universal docking station having an interlocking mechanism to securely assemble upper and lower shells together thereby ensuring tight connection between upper and lower shells and which benefits EMI-free signal transmission.

Accordingly, the universal docking station in accordance with the present invention comprises an upper shell, a lower shell, and a circuit board carrying a plurality of connectors thereon. The lower shell has a bottom section and a front and rear panels respectively extending from longitudinal edges of the bottom section. A plurality of ports is formed in predetermined positions of the panels for receiving connectors therein. The lower shell has several supporting blocks for supporting the circuit board at a predetermined position after the upper and the lower shells assembled together. The upper shell forms a pair of side walls extending from lateral edges thereof. An interlocking means comprises an upper and lower locking devices for assembling the upper and the lower shells together.

Other objects, advantages and novel features of the invention will become more apparent from the following detailed description when taken in conjunction with the accompanying drawings.

DETAILED DESCRIPTION OF THE INVENTION

Figure 1:
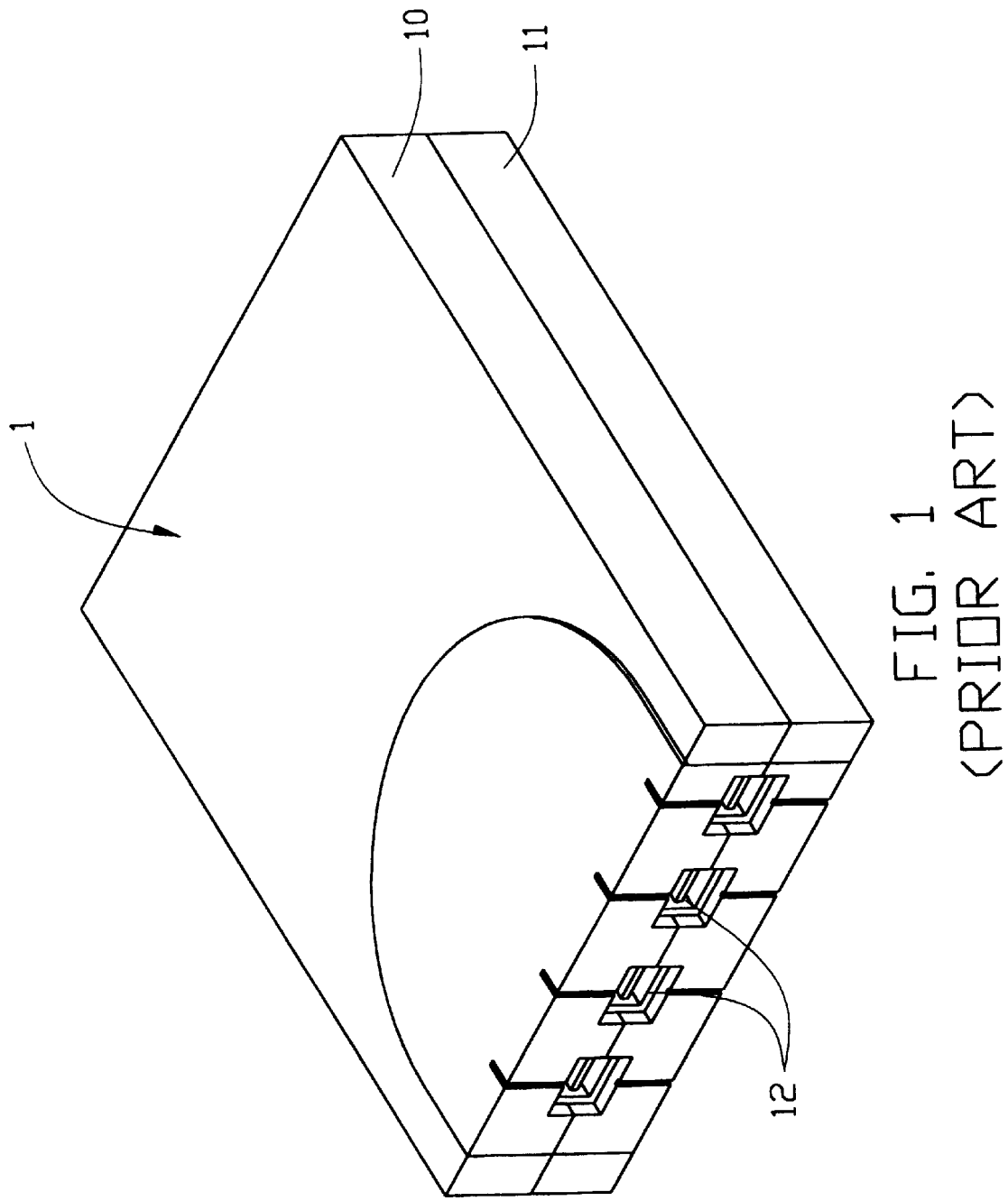
FIG. 1 is a perspective view of a conventional docking station.
Figure 2:
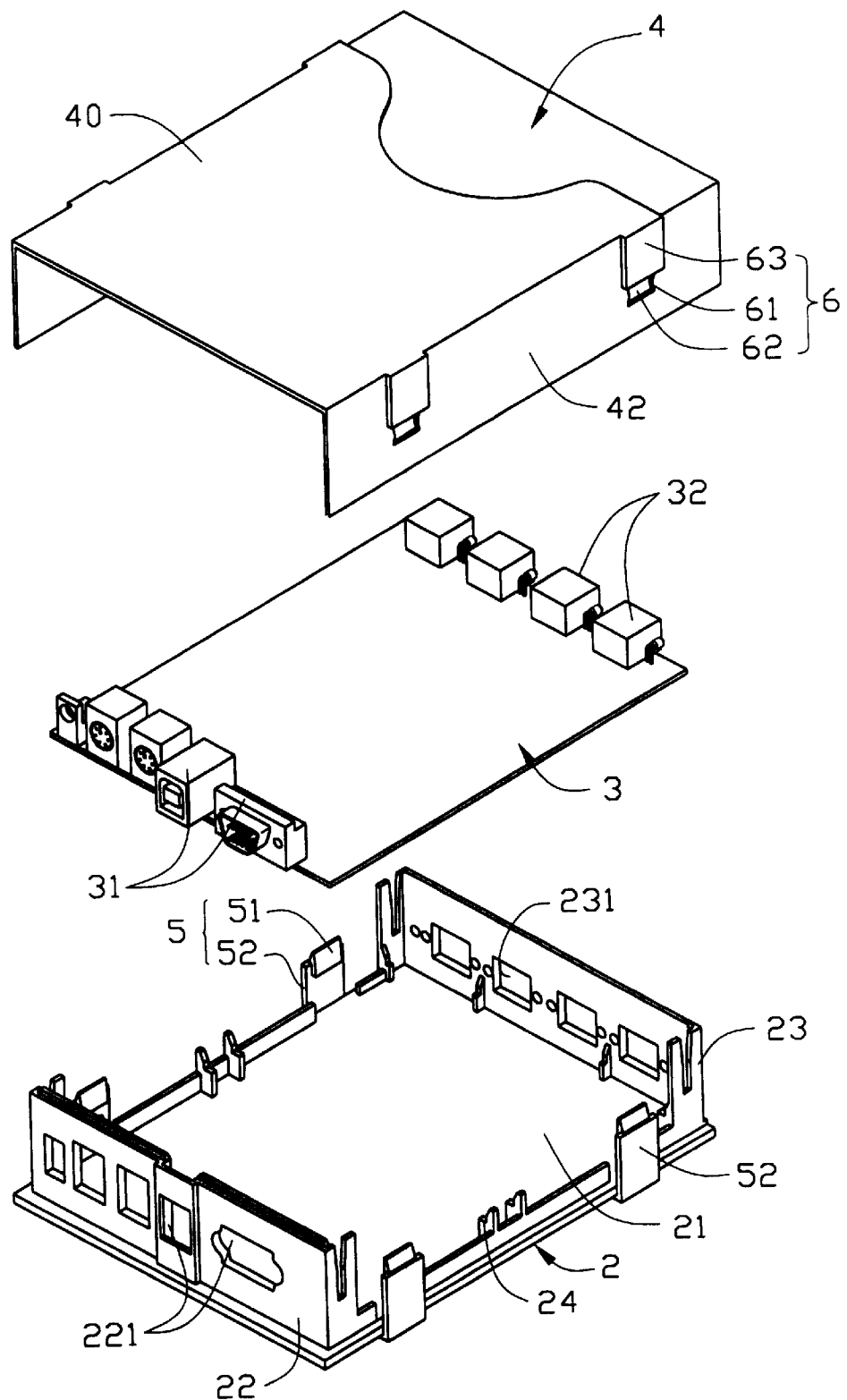
FIG. 2 is an exploded view of a universal docking station in accordance with the present invention.
Figure 3:
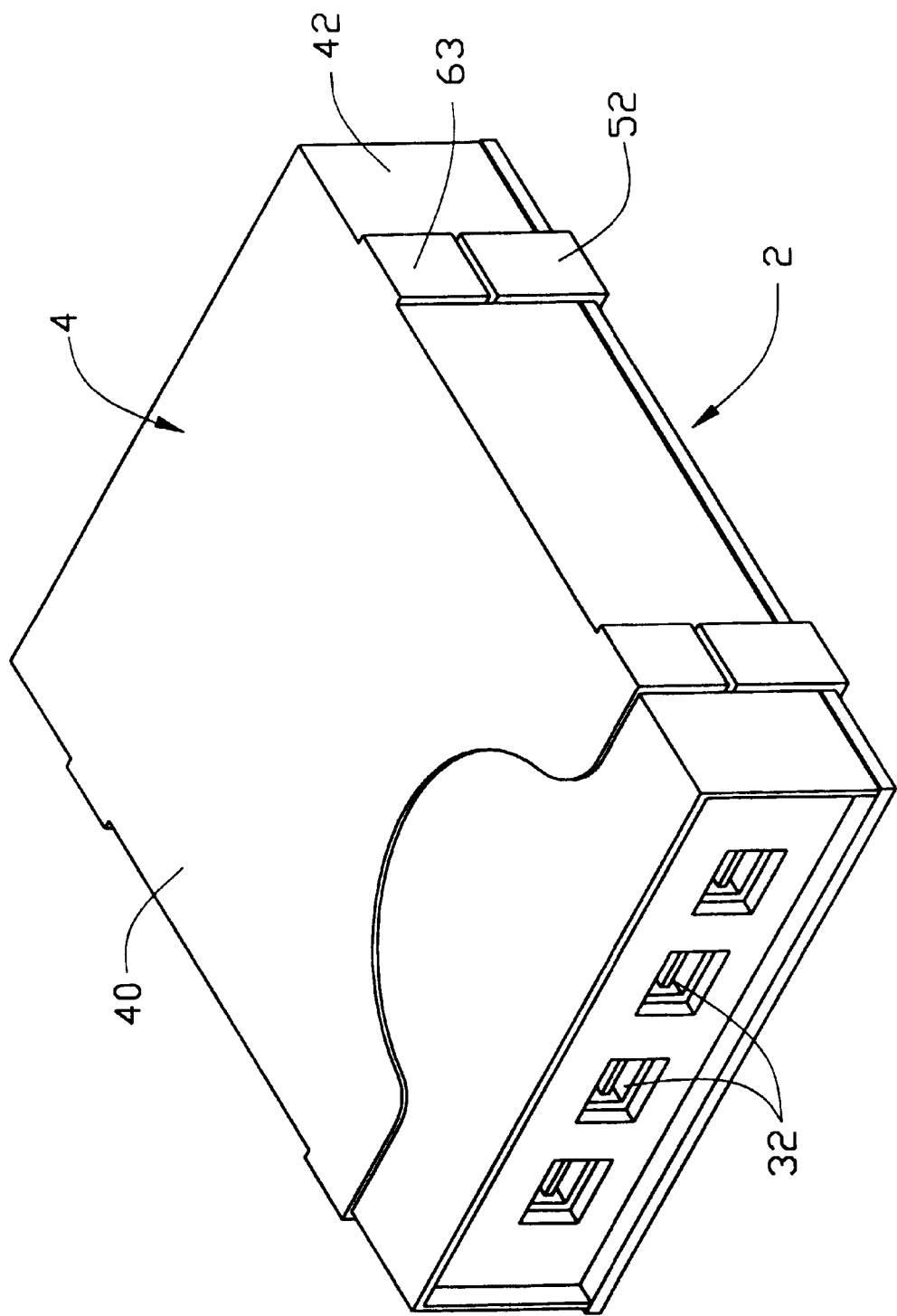
FIG. 3 is an assembled view of FIG. 2.

Referring to FIGS. 2 and 3, a lower shell 2 has a bottom section 21 and front and rear panels 22, 23 respectively extended from front and rear edges of the bottom section 21. A plurality of ports 221, 231 is formed in the front and rear panel 22, 23 for respectively engaging with corresponding connectors 31, 32. A plurality of supporting blocks 24 is formed on inner edges of the bottom section 21 for supporting a circuit board 3 thereon. The electrical connectors 31, 32 are mounted on opposite edges of the circuit board 3 for connecting with outer devices such as a mouse, a keyboard, and a network interface.

An upper shell 4 has a ceiling section 40 positioned opposite the bottom section 21, a pair of side walls 42 formed along longitudinal sides of said ceiling sections 40. The circuit board 3 is assembled between the shells 2, 4 to be enclosed and protected thereby. An interlocking means comprises lower and upper locking devices 5, 6 which are respectively formed on the lower and upper shells 2, 4.

Figure 4:
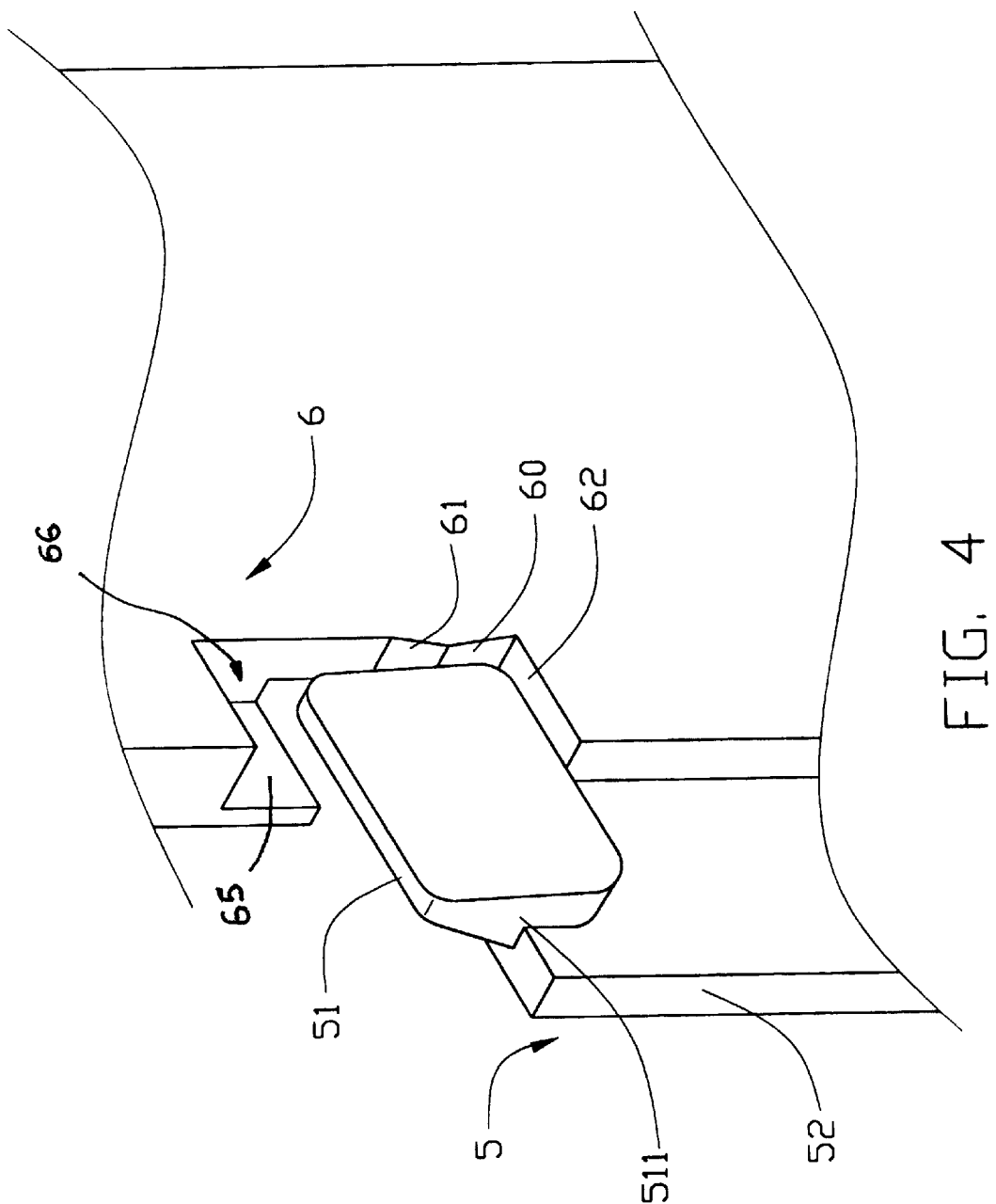
FIG. 4 is a sectional, enlarged view of the universal docking station showing a first engaging position of a pair of upper and lower locking device.
Figure 5:
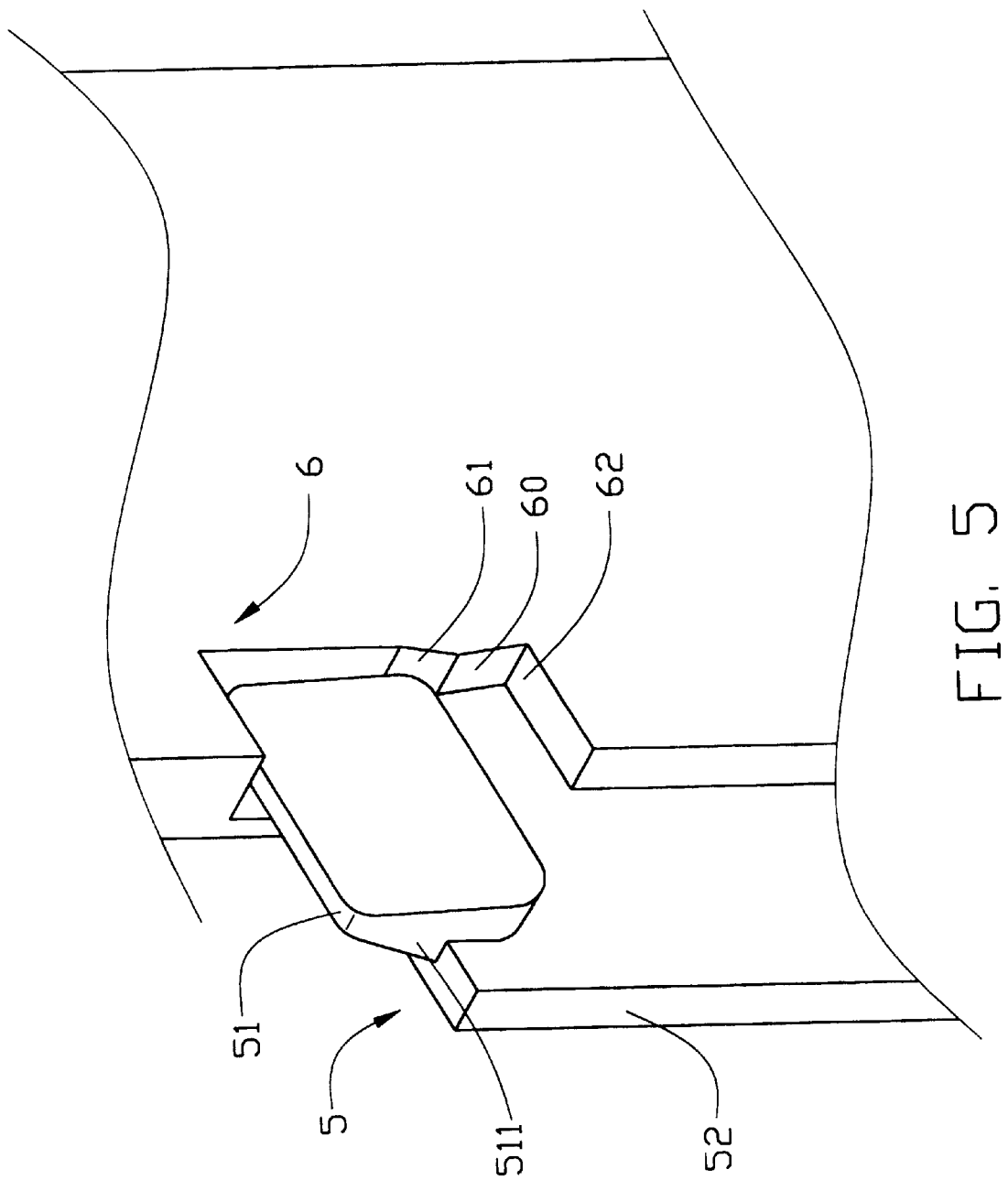
FIG. 5 is a view similar to FIG. 4 but showing a second engaging position of the upper and lower locking devices.

Also referring to FIGS. 4 and 5, the lower locking device 5 has a short side wall 52 extending from the bottom section 21 and a locking tab 51 inwardly extending from a top portion of the short side wall 52. The upper locking device 6 has a high side wall 63 extending from the ceiling section 40 and a latching opening 62 defined in the side wall 42 of the upper shell 4 for receiving the locking tab 51. A stopper 65 is formed at a lower end of the high side wall 63. A recess 66 is defined between an inner face of the high side wall 63 and the stopper 65 and located above the latching opening 62. A pair of inclined faces 60, 61 is formed on inner sides of the latching opening 62 for supporting the locking tab 51. The locking tab 51 forms a pair of bevels 511 on lateral sides thereof for engaging with the inclined face 61. During assembly, as shown in FIG. 4, the locking tab 51 is located at a lower position between the inclined faces 60. When the upper shell 4 is pressed down, the locking tab 51 will be displaced to a higher position to engage with the inclined face 61. Under this situation, the upper portion of the locking tab 51 is received within the recess 66 and engaged with the stopper 65 of the upper locking device 6, thus assuring latching function thereof.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. A universal docking station comprising:
    a lower shell including bottom section, lower locking device formed along longitudinal sides of said bottom section, front and rear panels formed on opposite ends of said bottom section, each of said front and rear panels defining a plurality of ports therein;
    an upper shell assembled to said lower shell, including a ceiling section and side walls formed along longitudinal sides of said ceiling sections, at least portions of the side walls being overlapped with said lower locking deices of said lower shell;

a circuit board carrying a plurality of connectors thereon and disposed within a space defined between said upper and lower shells, each of said connectors being accessible from a corresponding one of said ports; and interlocking means between said upper and lower shells, including latching openings formed on said upper shell, and locking tabs extending from said locking device for engaging with said latching openings, a pair of inclined faces being formed on inner sides of each latching opening for supporting the locking tabs and the locking tabs each having a pair of bevels for facilitating engagement with the inclined faces.

2. The universal docking station as claimed in claim 1, wherein a plurality of supporting blocks are formed on inner edges of the lower shell for supporting the circuit board at a predetermined position.

3. An locking arrangement for enclosing a circuit board therein, comprising:

upper and lower shells secured to each other and commonly defining a space therein for receiving said circuit board;

an upper locking device formed on the upper shell, said upper locking device defining a latching opening with an inclined surface around its edge, a recess formed above the latching opening with a stopper thereabouts; and a lower locking device formed on the lower shell, said lower locking device defining a locking tab; wherein said locking tab is moved laterally into the latching opening, and successively urged to move upward by said inclined surface and finally in an upper position where an upper portion of the locking tab is received in the latching opening and latchably engaged with the stopper.

* * * * *